United States Patent [19]
Hagenauer

[11] Patent Number: 5,511,081
[45] Date of Patent: Apr. 23, 1996

[54] METHOD FOR SOURCE-CONTROLLED CHANNEL DECODING BY EXPANDING THE VITERBI ALGORITHM

[75] Inventor: Joachim Hagenauer, Seefeld, Germany

[73] Assignee: Deutsche Forschungsanstalt für Luft- und Raumfahrt e.V., Köln, Germany

[21] Appl. No.: 95,708

[22] Filed: Jul. 22, 1993

[30] Foreign Application Priority Data

Sep. 22, 1992 [DE] Germany ............................ 42 24 214.2

[51] Int. Cl.⁶ ...................................................... H03M 13/12
[52] U.S. Cl. .................................................. 371/43; 371/45
[58] Field of Search .................................. 371/43, 45, 30

[56] References Cited

PUBLICATIONS

Hagenauer, J., "Forward Error Correction Coding for Fading Compensation in Mobile Satellite Channels", IEEE J. on Selected Areas in Communications, vol. SAC–5, No. 2, Feb. 1987, pp. 215–225.

*Primary Examiner*—Stephen M. Baker
*Attorney, Agent, or Firm*—Browdy and Neimark

[57] ABSTRACT

Improved Viterbi decoding of radio signals of the type calculating a metric increment $$\lambda_k = \sum_{i=1}^{N} (a_{k,i} \cdot x_{k,i} \cdot y_{k,i}),$$

wherein $\lambda_k$ is calculated at time intervals indexed by k, i is a data bit position index, y is a received value, x is a coded bit of a predetermined sequence, and a is a fading factor, uses a metric addition $B_k$ according to the equation $$\lambda_k = \left[ \sum_{i=1}^{N} (a_{k,i} \cdot x_{k,i} \cdot y_{k,i}) \right] + B_k,$$

where $B_k$ is a function of the quantity $$u_k L_k = \log_{10}[P(u_k = +1)/P(u_k = -1)].$$

If the channel is binary symmetrical, $B_k = u_k L_k / L_{0k}$ where $L_{0k} = \log[(1-P_{0k})/P_{0k}]$ and $P_{0k}$ is the binary symmetrical channel error probability. If the channel is a gaussian and fading channel then $B_k = u_k L_k / [(E_s/N_0) \log_{10} e]$ where $E_s/N_0$ is the channel signal-to-noise ratio and $\log_{10} e$ is approximately equal to 0.434.

6 Claims, 3 Drawing Sheets

METHOD FOR SOURCE-CONTROLLED CHANNEL DECODING BY EXPANDING THE VITERBI ALGORITHM

BACKGROUND OF THE INVENTION

1. Field of the Invention

The invention relates to a method for source-controlled channel decoding by expanding the Viterbi algorithm incorporating a priori and a posteriori information on the source symbols.

2. Description of the Prior Art

In the digital transmission of source signal, such as speech, sound, pictures, television, after a source coding, for example a pulse code modulation (PCM), a redundancy-reducing or irrelevance-reducing coding (i.e. MUSICAM), etc., a coding in the broadest sense is employed, for example in the form of a) channel coding b) coded modulation c) crosstalk, for example by multipath propagation at channel.

In most cases, the transmission methods set forth above under a) to c) can be represented by a so-called "finite state" machine having v states. Examples of this are convolutional codes, trellis-coded modulation methods, a multistage coded modulation, transmission channels with crosstalk, magnetic recording channels, and the like. The initial symbols are received disturbed after a transmission and the source data are to be detected by means of a receiver to reestablish the useful signal.

When using shift registers or the so-called finite state machine for this purpose advantageously the Viterbi algorithm (VA), a sequential decoding, the M algorithm or algorithms derived therefrom are employed. The algorithms and the apparatuses implemented therewith perform a "maximum-likelihood" (ML) estimation or a "maximum a posteriori" (MAP) estimation of the source data. Errors in such an estimation lead to errors in the source signals, particularly when significant symbols, for example the most significant bits in the PCM coding, are falsified.

The Viterbi algorithm is prior art and is used widely in the applications set forth above under a) to c). Furthermore, various expansions and implementation forms of the Viterbi algorithm exist, including the soft output Viterbi algorithm only (SOVA) which is described in patent specification DE 39 10 739, in which further publications on the Viterbi algorithm are mentioned.

The Viterbi algorithm used for a detection, i.e. for example for a demodulation, equalization, decoding, and the like, cannot in the present form employ any a priori or a posteriori knowledge of the pulse data sequence although such knowledge is frequently available, such as known bits or known bit frequencies, or can be obtained With the aid of methods as will be described in detail hereinafter. However, a Viterbi algorithm employed in the same manner as hitherto cannot use this information.

SUMMARY OF THE INVENTION

Consequently, the invention aims at providing a method for expanding the Viterbi algorithm in which detection information on the source bits can be employed in an advantageous manner.

The invention therefore proposes a method for source-controlled channel coding by expanding the Viterbi algorithm, in which method for weighting certain information a number of states (for example, the state $u_k=1$) are raised (or lowered) by a metric addition term $B_k$. $B_k$, containing available a priori or a posteriori information, is determined from the probability $P(u_k=1)$ corresponding to the metric increment $$\lambda_k = \sum_{i=1}^{N} a_{k,i} x_{k,i} y_{k,i}$$

where $x_{k,i}$ denotes the ith bit (i=1, ... ,N) at time k, $y_{k,i}$ is the corresponding received value, and $a_{k,i}$ is a fading factor, and where $B_k$ is $$B_k = \frac{u_k L_k}{L_{ok}}$$

in the case of a binary symmetrical channel (BSC) and $$B_k = \frac{u_k L_k}{E_s/N_0 \log e}$$

in the case of a Gaussian and fading channel, where $$u_k L_k = \log \frac{P(u_k = +1)}{P(u_k = -1)}$$

and $E_s/N_0$ is the signal-noise ratio (SNR) and $$L_{ok} = \log \frac{1 - P_{ok}}{P_{ok}}$$

with the error probability $P_{ok}$ of the binary symmetrical channel (BSC).

The method according to the invention for expanding the Viterbi algorithm and the further developments thereof can be employed in particularly advantageous and convenient manner for improving the decoding in the D network according to the GSM standard in the manner set forth with the method steps of claim 5.

According to the invention, in the method for expanding the Viterbi algorithm some states, for example half thereof, are raised or lowered by a metric addition for emphasizing certain information bits on which a priori or a posteriori information are available. The metric addition is determined from the probability $P(u_k=1)$ which matches the metric increment.

The method according to the invention here may be implemented in the form of an addition implemented in hardware, firmware or software, which can be added in simple manner to all the detection methods a) to c) set forth at the beginning and with a large number of source signals leads to a considerable improvement of the signal quality when disturbances occur in the transmission of coded signals. With knowledge on the statistics, correlation and the like of the information sequence the detection is considerably improved because the control of the Viterbi algorithm is better. Furthermore, a method for detection taking account of source information can be used in particularly advantageous manner for example directly in the transmission in the D mobile radio network according to the GSM standard.

BRIEF DESCRIPTION OF THE DRAWINGS

Hereinafter the invention will be explained in detail with the aid of preferred embodiments with reference to the attached drawings, wherein.

Figure 4:
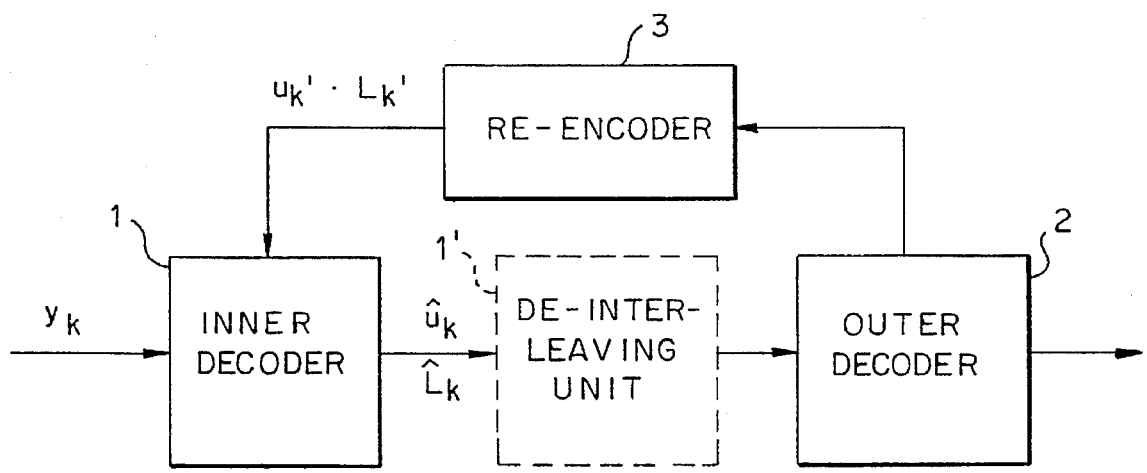
Figure 5:
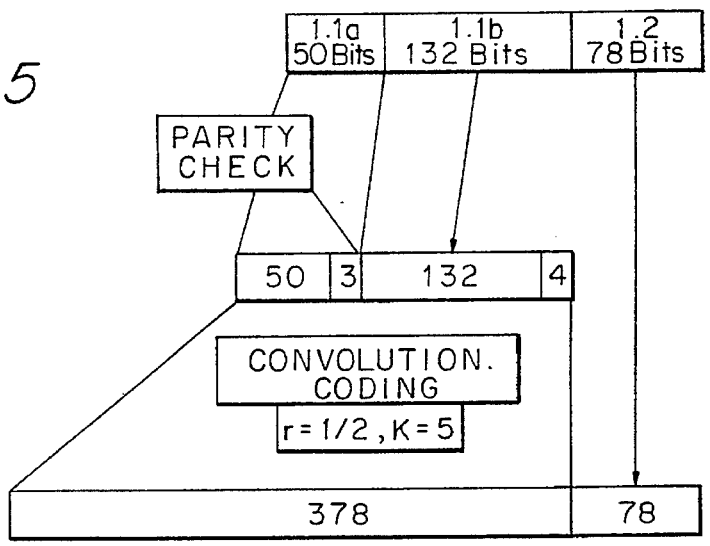
Figure 6:
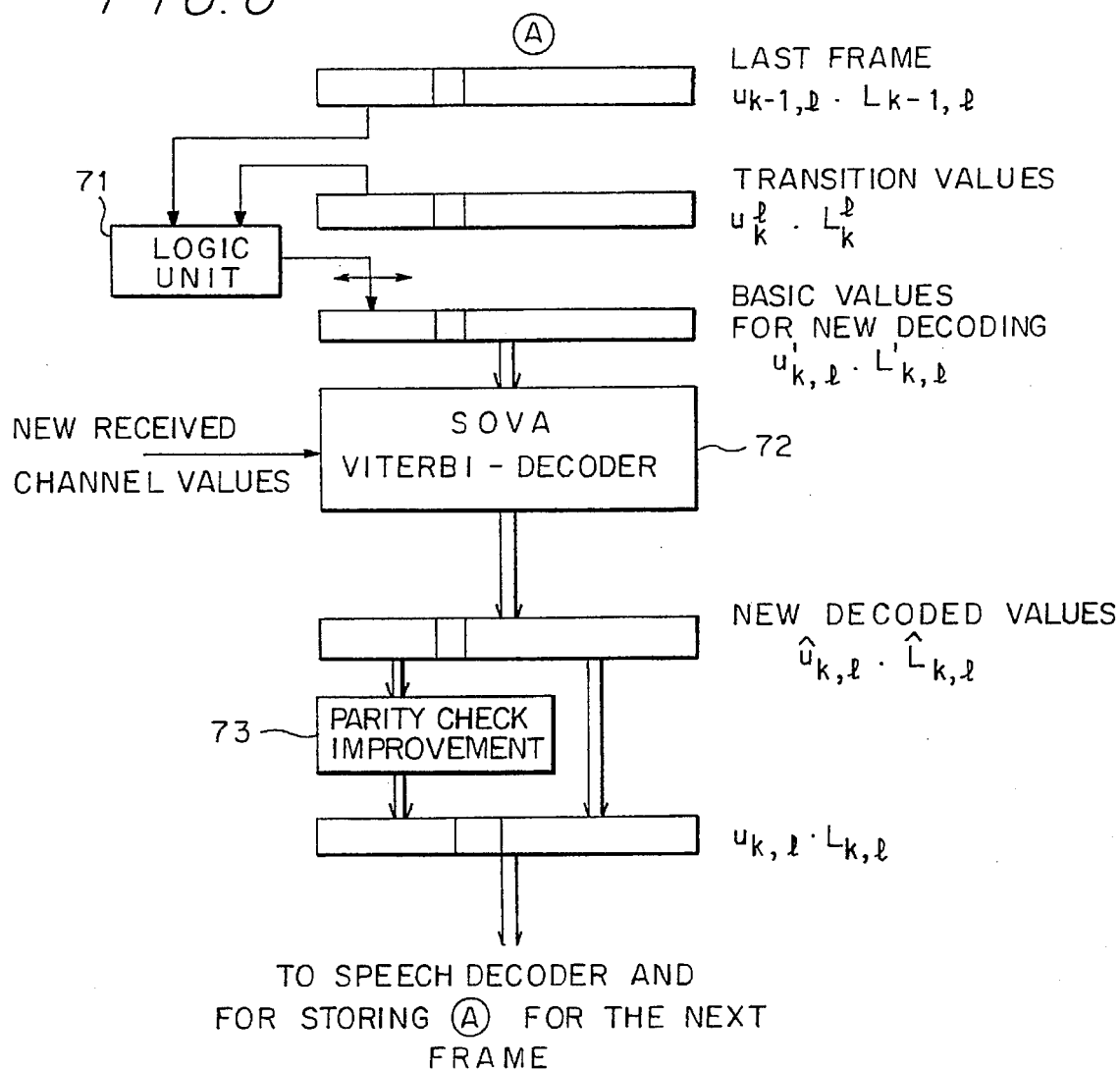

for five-times oversampled PCM;

FIG. 4 is a block diagram of a linked code system;

FIG. 5 is a schematic representation of an error protection diagram in the D mobile radio network, and FIG. 6 is a schematic illustration for implementing a method for improved decoding in the D radio mobile network in the GSM standard.

DESCRIPTION OF THE PREFERRED EMBODIMENTS

Figure 1:
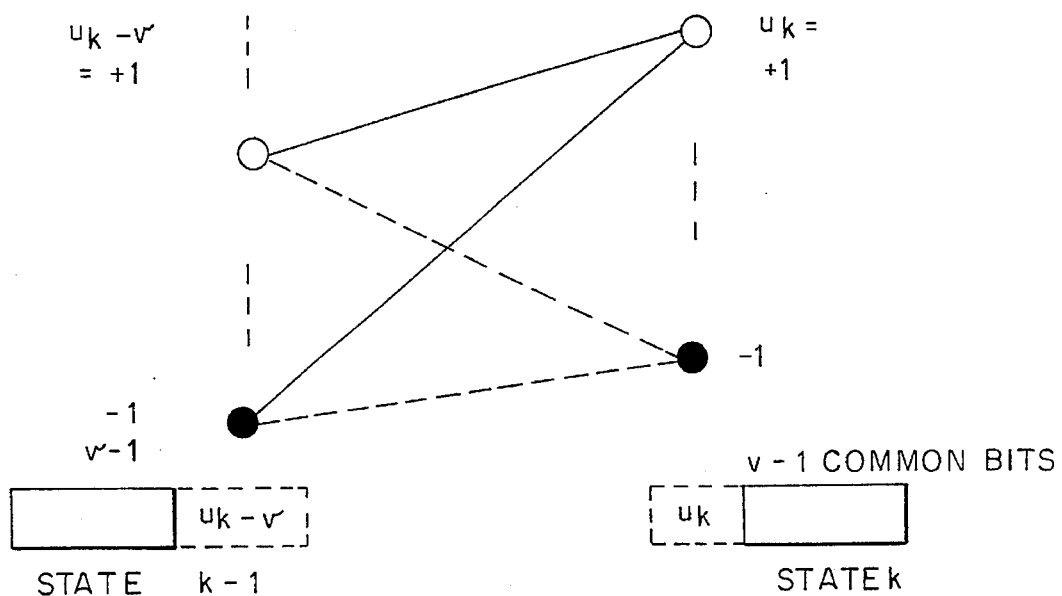
FIG. 1 shows a fragment of a so-called shift register trellis.

According to the invention, in a decoding of a generalized coding the decoding is a so-called binary "trellis" with $2^v$ states, the trellis being made up of the state transitions set forth in FIG. 1. In FIG. 1, u denotes the data and v a memory length. The full rectangles in the trellis illustrate the bits which do not change at this transition. The outlined circles are the bits with +1 and the solid circles those with −1. The binary representation chosen here is +1 for "0" and −1 for "1".

On shifting through one clock pulse in the binary trellis the last bit $u_{k-v}$ drops out and at the front the bit $u_k$ is shifted in.

On deriving the a posteriori probabilities $$\max_m p(\underline{s}^{(m)}/\underline{y}) \tag{1}$$

with the aid of the Baye's rule and the state relationship.

$$P(\underline{s}_k) = P(\underline{s}_{k-1}) \cdot P(u_k) \tag{2}$$

it is seen that the Viterbi algorithm is changed and in equation (2) with $P(\underline{s}_k)$ or $P(\underline{s}_{k-1})$ the probability of the old or new state is denoted and with $P(u_k)$ the probability of the new information bit.

Instead of the cost function $$M_k^{(m)} = M_{k-1}^{(m)} + \lambda_k^{(m)} \tag{3}$$

$$\lambda_k^{(m)} = \ln p(y_k|s_{k-1}^{(m)}, s_k^{(m)}) \tag{4}$$

a new cost function is used with is as follows:

$$M_k^{(m)} = M_{k-1}^{(m)} + \lambda_k^{(m)} + B_k \tag{5}$$

wherein $M_k^{(m)}$ denotes the metric m of the mth pulse sequence for the clock pulse k, $\lambda_k$ the corresponding metric increment and $B_k$, the new additional metric term.

The "new" Viterbi algorithm operates in the first step like the "old" Viterbi algorithm, i.e. it calculates for the new states the metric increment $\lambda_k$ and two new metrics and it further selects the metric $M_k^{(m)}$ with the lowest costs and stores the surviving path.

Further possible methods for implementations are the "TRACEBACK" or the "register exchange" methods.

According to the invention the last term $B_k$ is to be added to the metrics of the states with u= +1 before the Viterbi algorithm advances one clock pulse. In a shift register array these are the first $2^{v-1}$ states. The term $B_k$ can change from one pulse to the other and can be continuously calculated by the receiver.

Methods according to the invention for this purpose will be described below. It will also be shown in some examples how the term $B_k$ is calculated in optimum manner, in particular relatively to the metric increment $\lambda_k$.

In the decoding of the convolution code of the rate 1/N after transmission via the binary symmetrical channel (BSC) of the coded bits $x_{k,i}$ (with i=1, ... N) the error probability $P_{ok}$ determines $$P(y_{k,i}|s_{k,i}) = \begin{cases} 1 - P_{ok} & y_{k,i} = x_{k,i} \\ p_{ok} & y_{k,i} \neq x_{k,i} \end{cases}$$

Then, the metric implement $\lambda_k$ is to be selected as usual as $$\lambda_k = \sum_{i=1}^{N} x_{k,i}^{(m)} \cdot y_{k,i} \tag{6}$$

and the new term is $$B_k = \frac{u_k \cdot L_k}{u_{ok} \cdot L_{ok}} \tag{7}$$

with $$u_k L_k = \log \frac{P(u_k = 1)}{P(u_k = -1)} \tag{8}$$

and $$L_{ok} = \log \frac{1 - P_{ok}}{P_{ok}} \tag{9}$$

$L_k$ and $L_{ok}$ being denoted likelihood values.

Since the error probability $P_{ok}$ is usually less than 0.5, the following holds $$B_k = u_k \frac{L_K}{L_{ok}} \tag{10}$$

Here, the term $u_k L_k$ with the known bit $u_k=1$ is to be set as $+\infty$ and with $u_k=-1$ to $-\infty$ or to the highest or lowest value used in the metrics. If the value $u_k L_k$ and $L_{ok}$ are not known, at the receiver in accordance with the invention corresponding estimation means are to be provided.

In a decoding in the Gaussian channel or in the Rayleigh channel the metric generally employed is a) for the Gaussian channel $$\lambda_k = \sum_{i=1}^{N} x_{k,i} y_{k,i} \qquad y_{k,i} \in R \tag{11a}$$

b) for the Rayleigh fading channel $$\lambda_k = \sum_{i=1}^{N} a_{k,i} x_{k,i} \cdot y_{k,i} \tag{11b}$$

with the fading amplitude $a_{k,i}$. According to the invention, the term $B_k$ (metric addition) for the two cases (11a and 11b)

$$B_k = \frac{1}{E_s/N_0 \log e} \log \frac{P(u_k = 1)}{P(u_k = -1)} \tag{12}$$

is then to be added for all states with u=+1, $E_s/N_0$ denoting the mean signal-noise ratio. Thus, in equation (11b) knowledge of the fading factor $a_{k,i}$ is necessary and for the terms $B_k$ in equation (12) in addition to the knowledge of the mean signal-noise ratio $E_s/N_0$ $$u_k \cdot L_k = \log \frac{P(u_k = 1)}{P(u_k = -1)} \tag{12a}$$

is necessary from a priori, a posteriori or other information. Likewise, a normalisation is to be carried out in the manner described.

Thus, according to the invention by controlling the Viterbi algorithm with the metric addition $B_k$ $$\frac{u_k L_k}{L_{ok}} \text{ or respectively } u_k L_k/(E_s/N_0) \log_{10} e, \quad (12b)$$

the states with $u_k = +1$ are preset.

If the channel is poor, i.e. the likelihood value $L_{ok}$ or the signal-noise ratio $E_s/N_0$ is small, the information estimation $u_k L_k$ becomes more important. On the other hand, with a good channel the term $B_k$ becomes small and the received channel values become more significant via the metric increment $\lambda_k$. Consequently, according to the invention a balance is also implemented in optimum manner between the prediction and received values.

Below further possibilities and examples of uses for determining the metric addition will be given.

1) Known training bits are introduced; then, for these bits:

$$B_k = \begin{cases} +\infty & u_k = +1 \\ -\infty & u_k = -1 \end{cases}$$

Here, $\infty$ is the maximum value of the numerical representation chosen in the decoder.

2) With an a priori knowledge it is frequently known that certain bits occur with a predetermined probability $P(u_k = +1)$; then, the selection should be $$u_k L_k = \log \frac{P(u_k = +1)}{1 - P(u_k = +1)}$$

Figure 2:
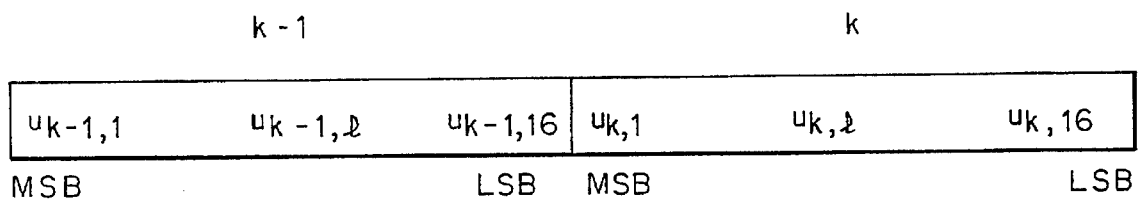
FIG. 2 is a schematic illustration of an example of a 16 bit pulse code modulation (PCM)

3) A correlation with previous data frames represents the most usual application. In PCM coding, speech transmission, for example in the D mobile radio network, in an audio transmission in the new DAB radio broadcasting system, in video transmission for example in future digital television, the data are transmitted in frames and coded framewise, as represented for example schematically in FIG. 2, where MSB denotes the most significant bit and LSB the least significant bit.

Figure 2A:
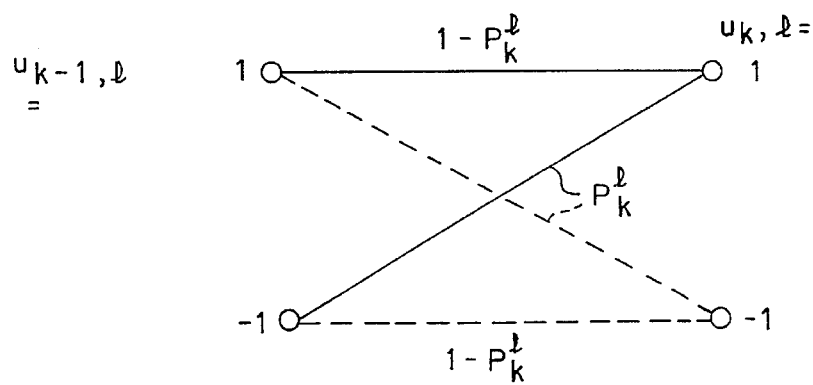
FIG. 2a is a schematic illustration of transition probabilities with correlated binary bits.

In the schematic illustration of FIG. 2a transition probabilities $P_k$ are represented with correlated binary bits. If the previous frame (k−1) is already decoded, i.e. the data $u_{k-1,l}$ are known, then with known correlation probability $P_k^l$ the value required for the metric addition (base term) can be calculated. The metric addition can therefore be determined:

$$u_{k,l} \cdot L_{k,l} = u_{k-1,l} \cdot \log \frac{1 - P_k^l}{P_k^l} \quad (13)$$

Figure 3:
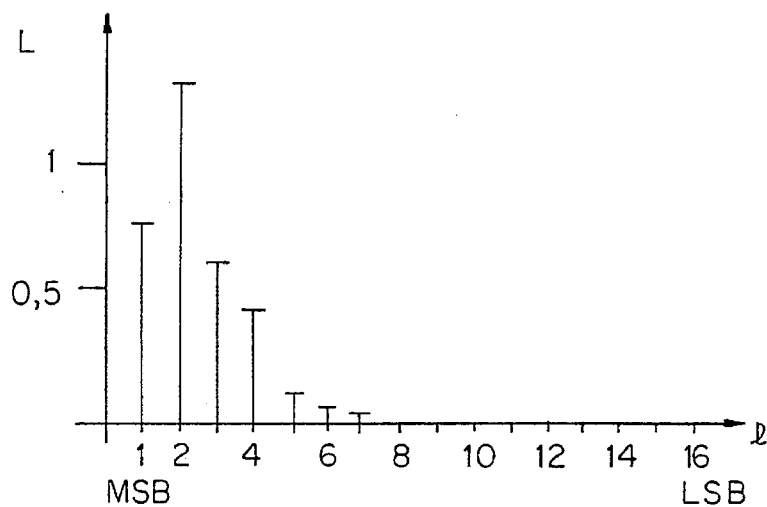
FIG. 3 is a diagram of a measured probability ratio $$L_k = \log \frac{P(u_k = 1)}{P(u_k = -1)}$$

In FIG. 3, as example the measured transition likelihood value $L_k$ with five-fold oversampled pulse code modulation (PCM) is illustrated, the likelihood value being plotted on the ordinate and the index l of the lth PCM bit on the abscissa.

Even more accurate values can be obtained if the SOVA algorithm described in DE 39 10 739 C2 is used instead of the Viterbi algorithm. In this case, from the previous frame not only the decision $u_{k-1,l}$ is available but also the likelihood value $L_{k-1,l}$ thereof; this then gives:

$$u_{k,l} \cdot L_{k,l} = u_{k-1,l} \cdot \log \frac{1 + e^{(L_{k-1,l} + L_k^l)}}{e^{L_{k-1,l}} + e^{L_k^l}} \quad (14)$$

or as an approximation $$u_{k,l} \cdot L_{k,l} = u_{k-1,l} \cdot \min(L_{k-1,l}, L_k^l) \quad (15)$$

This value is then used in the metric addition (equation 12b). This means that according to the invention the base value, i.e. the metric addition, combines in optimum manner the reliability of the previous decisions with the statistical correlation of consecutive source frames. Also, a combination with other a priori or a posteriori information is readily possible.

This method is applicable to any source compression procedure. For this purpose, only the correlations of the bits of consecutive source frames need be known or continuously estimated. The estimation of the values $P_k^l$ may also be carried out continuously in recursive and adaptive method. For this purpose, from K preceding frames the relative frequencies of change processes of the bits $u_{k,l}$ are estimated:

$$P_k^l \approx \frac{\text{number of the values with } u_{k-1,l} \cdot u_{k,l} = -1}{K} \quad (16)$$

and $$L_k^l = \log \frac{\text{number of the } u_{k-1,l} \cdot u_{k,l} = +1}{\text{number of the } u_{k-1,l} \cdot u_{k,l} = -1} \quad (17)$$

in the last K frames. Here, a progressive weighting of the recently occurred deviations may be carried out to enable rapid changes of the correlation of the source signals to be followed.

4) By iterations with concatenated code systems or with product codes, the decoding can be improved after the decisions of the second stage when the latter are added to the first stage as a posteriori information.

It is assumed here that the inner code can be decoded by an expanded Viterbi algorithm (SOVA). With a stage or product code coding as apparent from FIG. 4, the received code values $y_k$ are decoded in the inner decoder 1, possibly with one of the methods described at the beginning under a) to c). After any possibly necessary de-interleaving by a de-interleaving unit 1' after the decoding of the outer code "better" recoded values $u_k'$ are available in the outer decoder 2 and their reliabilities $L_k$ at the output of an outer re-encoder 3 and possible de-interleaving. Thus, the inner decoder 1, which now has the metric additions (base terms) at its disposal, is again decoded in accordance with the method according to the invention and consequently an iteration of the decoding initiated.

This type of iteration is particularly effective when good reliabilities are furnished by the outer decoder 2 and by the re-encoder 3. This is for example the case when the outer decoder 2 decodes reliably, for example with Reed-Solomon codes having a small decoding error probability, or is also the case when the outer code furnishes reliable values $L_k$, for example with parity check codes and orthogonal methods processed by the Battail method, as described by G. Battail in "Coding for the Gaussian Channel: The Promise of Weighted-Output-Decoding" in INT. Journal of Satellite Communications, vol. 7, pages 183 to 192 (1989).

Applications of the described method are product codes from two convolutional codes, convolutional and parity check codes, trellis-coded modulation and convolutional codes as well as Reed-Solomon codes as in ESA/NASA deep-space standard.

Hereinafter, with reference to a preferred embodiment a use of the method according to the invention for expanding the Viterbi algorithm will be described with regard to improving decoding in the D mobile radio network which is configured by the GSM standard. For this purpose, in FIG. 5 as example a schematic illustration of an error protection diagram for the full rate codec of the D mobile radio network is shown. In the upper part of the diagram frame-organised speech data are divided into three subframes of different protection rating, i.e. into 50 bits of the class 1a, 132 bits of the class 1b and 78 bits of the class 2.

The 50 bits of the class 1a are first coded by means of a block code in the form of a parity check by adding 3 parity bits in the diagram of FIG. 5. The 132 bits of the class 1b are expaned by 4 known terminal bits. The 132 bits of the class 1b expanded by the 4 terminal bits are then attached to the coded 53 bits of the class 1a and thereafter subjected to a convolutional coding with a rate r=½ and an constraint length K=5.

As apparent from the lower part of the diagram in FIG. 5, finally the 78 bits of the class 2 are appended to the convolutional-coded bits, 378 bits in the embodiment illustrated, and thus in their entirety represent the coded speech data, the frame of which is transmitted in this form. A division of the so-called half-rate codec is used analogously to this procedure.

The decoding according to the method of the invention can be improved for both methods, as will be explained below. In FIG. 6 a schematic illustration is given for receiver-side implementation of a method with regard to improving a decoding in the D mobile radio network according to the GSM standard.

In the decoding of the first frame the decoder 72 employs only the channel values and finally generates in accordance with the SOVA algorithm (DE 39 10 739 C2) the values $u_{k-1,l} L_{k-1,l}$. These values are available for the next frame together with the transition values for determining the metric additions (base values) in accordance with the present invention.

In the receiver-side decoder illustrated in FIG. 6 decisions $u_{k-1}$ from the preceding speech frames are stored, and the quality of these decisions $L_{k-1,l}$ for the 50 test bits of the class 1a, i.e. for the bits= 1 ... 50, for the 3 bits l=51, 52 and 53 provided in the embodiment and for the 132 bits of the class 1b, i.e. for the bits l=54, ... , 185. Thereafter, from transitions values $u_k^l \cdot L_k^l$ in a logic unit 71 by for example the operation $$u'_{k,l} = u_k^l \cdot u_{k-1,l}$$

and $$L'_{k,l} = \alpha \cdot min\{L_{k-1,l}, L_k^l\}$$

with a factor $\alpha \leq 1$ new metric additions $u'_{k,l}, L'_{k,l}$ are set for a new decoding in the trellis of a Viterbi decoder. The factor $\alpha$ is chosen close to 1 when the previous values are trusted and closer to 0 when they are not trusted.

With newly received time-dicrete channel values available as soft or hard decisions, possibly with channel state information, and which are entered into a so-called SOVA (soft output VA) Viterbi decoder 72, a SOVA Viterbi decoding is then carried out so that at the output thereof new decoded values $\hat{u}_{k,l}, \hat{L}_{k,l}$ appear. Thereafter, bits protected for example by block codes, the bits 1, ... , 53 in the embodiment set forth, are subjected by a parity test in the unit 73 to a subsequent improvement, and for the bits linked by a parity relationship $$\prod_{i \in \{I_n\}} \hat{u}_i = 1 \quad \hat{u}_i = \pm 1; \quad n = 1, 2, 3$$

the following improvement is then set:

$$u_j L_j = \hat{u}_j \hat{L}_j + \prod_{\substack{i \in \{I_n\} \\ i \neq j}} \hat{u}_{ji} \cdot \min_{\substack{i \in \{I_n\} \\ i \neq j}} \{\hat{L}_i\}$$

for all $j \in \{I_n\}$ with $n = 1, 2, 3$

Thus, both for the source decoder in the receiver and for the decoding of the next speech frame new bits $u_{k,l}$ and their quality $L_{k,l}$ are available. This is indicated in FIG. 6 by the reference entered at the bottom arrow "to the speech decoder and for storing for the next frame" which in its basic sequence corresponds to the frame shown at the top in FIG. 6.

I claim:

1. In Viterbi decoding of radio signals of the type calculating a metric increment $$\lambda_{k,k} = \sum_{i=1}^{N} (a_{k,i} \cdot x_{k,i} \cdot y_{k,i}),$$

wherein $\lambda_k$ is calculated at time intervals indexed by k, i is a data bit position index, y is a received value, x is a coded bit of a predetermined sequence, and a is a fading factor, the improvement comprising:

source-controlled channel coding wherein a metric addition $B_k$ is incorporated into the decoding according to the equation $$\lambda_k = \left[ \sum_{i=1}^{N} (a_{k,i} \cdot x_{k,i} \cdot y_{k,i}) \right] + B_k,$$

where $B_k$ is a function of the quantity $$u_k L_k = \log_{10}[P(u_k=+1)/P(u_k=-1)]$$

and if the channel is a binary symmetrical channel then $$B_k = u_k L_k / L_{0k}$$

where $$L_{0k} = \log [(1-P_{0k})/P_{0k}]$$

and $P_{0k}$ is the binary symmetrical channel error probability; and if the channel is a gaussian and fading channel then $$B_k = u_k L_k / [(E_s/N_0) \log_{10} e]$$

where $E_s/N_0$ is the channel signal-to-noise ratio and $\log_{10} e$ is approximately equal to 0.434.

2. The improvement according to claim 1, characterized in that the value $u_k L_k$ for known or for hard decided bits $u_k$ without quality information $L_k$ is selected as $u_k \cdot L_{max}$, the likelihood value $L_{max}$ being the implementation-dependent maximum possible value of a metric arithmetic and logic unit.

3. The improvement according to claim 1, characterized in that for determining the likelihood value $L_{k,l}$ for a frame-bound transmission a product is obtained from earlier decisions $u_{k-1,l}$ and earlier likelihood values $L_{k-1,l}$ and the transition values $L_k^l$ corresponding to $$u_{k,l} \cdot L_{k,l} = u_{k-1,l} \cdot \log \frac{1 + e^{(L_{k-1,l} + L_k')}}{e^{L_{k-1,l}} + e^{L_k'}}$$

or an approximation $$u_{k,l} \cdot L_{k,l} = u_{k-1,l} \cdot min(L_{k-1,l}, L_k').$$

4. The improvement according to claim 3, characterized in that the transition values ($L_{k,l}$) are determined continuously in accordance with $$L_k^l = \log \frac{\text{number of the } u_{k-1,l} \cdot u_{k,l} = +1}{\text{number of the } u_{k-1,l} \cdot u_{k,l} = -1}$$

from the last K values at the corresponding positions of the preceding frames, the latest values preferably being overweighted.

5. The improvement according to claim 4 for improving the decoding of a stage or product code or a coding with inner and outer code, characterized in that the information bits $u_k$ and their likelihood values ($L_k$) can be used after a decoding with the outer code and a possible de-interleaving as $u_k' L_k'$ for determining the metric addition (according to claim 1) and thus for a new iterative decoding of the inner code, and then after the decoding of the outer code the entire operation can be repeated in iterative manner, and in the case where the outer code is a convolutional cod the recoded bit is determined as $$u_k' = \prod_i \bar{u}_{k,i}$$
where $c_{k,i} = 1$ $$L_k' = \min_i \bar{L}_{k,i}$$
where $c_{k,i} = 1$ $c_{k,i} = \{0,1\}$ being the elements of the generator matrix of the code.

6. The improvement according to claim 4 for improving a decoding in the D network according to the GSM standard in which speech data frame-organized on the transmitting side are divided into three subframes of different protection rating, that is into bits of the classes 1a, 1b and 2;

the data of the class 1a thus obtained are first coded by means of a block code;

then the data of the class 1b expanded by terminal bits are appended to the coded bits of the class 1a and then subjected to a convolution coding and transmitted, characterized in that in the receiving-side decoder decisions ($u_{k-1,l}$) from preceding speech frames are stored and the quality of said decisions $L_{k-1,l}$ for the bits of the class 1a, for the test bits and for bits of the class 1b;

thereafter from the transition values ($u_k' \cdot L_k'$) in a logic unit (71) by the operation $$u'_{k,l} = u_k^l \cdot u_{k-1,l}$$

and $$L'_{k,l} = \alpha \cdot min\{L_{k-1,l}, L_k^l\}$$

with a factor a $\alpha \leq 1$ the new metric additions ($B_k$) are adjusted in the trellis of the Viterbi decoder, being set to zero for the first frame, with the newly received time-discrete channel values a SOVA or normal Viterbi decoding (72) is then carried out and the new values $\hat{u}_{k,l} \cdot \hat{L}_{k,l}$ and $u_{k,l} \cdot L_{max}$ are furnished, and for the bits protected by block codes a subsequent improvement (73) is then possible, end for the bits linked by the parity relationship $$\prod_{i \in \{I_n\}} \hat{u}_i = 1 \quad \hat{u}_i = \pm 1; \quad n = 1, 2, 3$$

the following improvement is set:

$$u_j L_j = \hat{u}_j \hat{L}_j + \prod_{\substack{i \in \{I_n\} \\ i \neq j}} \hat{u}_{ji} \cdot \min_{\substack{i \in \{I_n\} \\ i \neq j}} \{\hat{L}_i\}$$

for all $j \in \{I_n\}$ with $n = 1, 2, 3$ for all $j \in \{I_n\}$ with n=1,2,3 so that for the source decoder (in the receiver) and the decoding of the next speech data frame the new bits ($u_{k,l}$) and their quality ($L_{k,l}$) are available.

* * * * *